United States Patent
Hu et al.

(10) Patent No.: US 11,912,919 B2
(45) Date of Patent: Feb. 27, 2024

(54) CORE-SHELL QUANTUM DOT, PREPARATION METHOD THEREOF, AND ELECTROLUMINESCENT LIGHT-EMITTING DEVICE CONTAINING THE SAME

(71) Applicant: Najing Technology Corporation Limited, Zhejiang (CN)

(72) Inventors: Baozhong Hu, Zhejiang (CN); Guangxu Li, Zhejiang (CN); Yanhong Mao, Zhejiang (CN); Yuan Gao, Zhejiang (CN); Yehua Su, Zhejiang (CN)

(73) Assignee: Najing Technology Corporation Limited, Zhejiang (CN)

(*) Notice: Subject to any disclaimer, the term of this patent is extended or adjusted under 35 U.S.C. 154(b) by 791 days.

(21) Appl. No.: 16/966,906

(22) PCT Filed: Dec. 29, 2018

(86) PCT No.: PCT/CN2018/125322
§ 371 (c)(1),
(2) Date: Aug. 3, 2020

(87) PCT Pub. No.: WO2019/153961
PCT Pub. Date: Aug. 15, 2019

(65) Prior Publication Data
US 2021/0047562 A1  Feb. 18, 2021

(30) Foreign Application Priority Data
Feb. 9, 2018  (CN) .................. 201810132073.4

(51) Int. Cl.
| C09K 11/88 | (2006.01) |
| B82Y 20/00 | (2011.01) |
| B82Y 30/00 | (2011.01) |
| B82Y 40/00 | (2011.01) |
| C01G 9/00 | (2006.01) |
| C01G 9/08 | (2006.01) |
| C01G 11/00 | (2006.01) |
| H10K 50/115 | (2023.01) |

(52) U.S. Cl.
CPC ............ C09K 11/883 (2013.01); C01G 9/006 (2013.01); C01G 9/08 (2013.01); C01G 11/006 (2013.01); H10K 50/115 (2023.02); *B82Y 20/00* (2013.01); *B82Y 30/00* (2013.01); *B82Y 40/00* (2013.01); *C01P 2004/64* (2013.01); *C01P 2004/80* (2013.01); *C01P 2004/82* (2013.01); *C01P 2006/60* (2013.01)

(58) Field of Classification Search
CPC . C09K 11/883; H10K 50/115; C01P 2004/06; C01P 2004/82; C01P 2004/80
See application file for complete search history.

(56) References Cited

U.S. PATENT DOCUMENTS

| 2017/0005226 A1 | 1/2017 | Mangum et al. |
| 2017/0323991 A1 | 11/2017 | Klimov et al. |
| 2019/0002719 A1* | 1/2019 | Pousthomis ......... C01G 11/006 |

FOREIGN PATENT DOCUMENTS

| CN | 102925158 A |   | 2/2013 |
| CN | 105802629   | * | 7/2016 |
| CN | 105802629 A |   | 7/2016 |
| CN | 106497546 A |   | 3/2017 |
| CN | 107230745 A |   | 10/2017 |
| CN | 108251117 A |   | 7/2018 |

OTHER PUBLICATIONS

Jing, Zhang et al. <Bright Gradient-Alloyed CdSeS Quantum Dots Exhibiting Cyan-Blue Emission>, «Chemistry of Materials» Jan. 8, 2016, p. 618-625.

Junsang Cho et al, <Kinetic studies on the formation of various II-VI semiconductor nanocrystals and synthesis of gradient alloy quantum dots emitting in the entire visible range>, «J. Mater. Chem.» Apr. 23, 2012, p. 10827-10833.

Eunjoo Jang et al. <High quality CdSeS nanocrystals synthesized by facile single injection process and their electroluminescence >, «Chem. Commun.» ,Nov. 7, 2003, p. 2964-2965.

Zhao, Bingxia et al. <Intrinsic quantum dot based white-light-emitting diodes with a layered coating structure for reduced reabsorption of multiphase phosphors> RSC Adv. vol. 4, Sep. 10, 2014, p. 45155-45158.

* cited by examiner

*Primary Examiner* — C Melissa Koslow

(74) *Attorney, Agent, or Firm* — Gang Yu

(57) ABSTRACT

This present disclosure provides a core-shell quantum dot, a preparation method thereof, and a light-emitting device containing the same. The core of the core-shell quantum dot is $CdSe_XS_{(1-X)}$, and the quantum dot shells include a first shell and a second shell, the first shell being selected from one or more of ZnSe, $ZnSe_YS_{(1-Y)}$ and $Cd_{(Z)}Zn_{(1-Z)}S$, the second shell covering the first shell being one of $Cd_{(Z)}Zn_{(1-Z)}S$ and ZnS, the maximum emission peak of the core-shell quantum dot is less than or equal to 480 nm, $0<X<1$, $0<Y<1$, $0<Z<1$. The $CdSe_XS_{(1-X)}$ core has a smaller bandgap and a shallower HOMO energy level, making hole injection easier.

15 Claims, No Drawings

CORE-SHELL QUANTUM DOT, PREPARATION METHOD THEREOF, AND ELECTROLUMINESCENT LIGHT-EMITTING DEVICE CONTAINING THE SAME

CROSS REFERENCE TO RELATED APPLICATIONS

This application is a national application of PCT/CN2018125322, filed on Dec. 29, 2018. The contents of PCT/CN2018125322 are all hereby incorporated by reference.

TECHNICAL FIELD

The present disclosure relates to the field of quantum dot materials, and more particularly to a core-shell quantum dot, a preparation method thereof, and an electroluminescent light-emitting device containing the same.

BACKGROUND

In recent years, due to high luminous efficiency, wide excitation range, narrow emission spectrum, and tunable color wavelength, quantum dot materials have been attracting more and more attention in biotechnology, solar cells, light-emitting diode applications and so on. At present, quantum dot TVs based on the photoluminescence principle of quantum dots, such as TCL quantum dot TVs which have a NTSC color gamut>110% and a color performance comparable to that of Organic Light-Emitting Diode (OLED) TVs, have successfully entered the consumer market, with good market feedback.

As the second-generation light-emitting technology of quantum dot materials, quantum dot light-emitting diode (QLED) is a research hotspot in recent years. In terms of red light, research group of Professor Peng Xiaogang of the Department of Chemistry of Zhejiang University, through the solution spin coating method, inserted an ultra-thin PMMA insulating layer between the quantum dot light-emitting layer and the electron injection layer to achieve the carrier injection balance. The ultra-high external quantum efficiency (EQE) of more than 20.5%, and the lifespan greater than 100,000 hours, and the performance having reached or even exceeded that of commercial OLED products, demonstrating the feasibility of QLED's future commercialization.

In terms of green QLED, use of graded alloy quantum dots was widely reported. In 2012, one Korean research group achieved an external quantum efficiency of 12.6% by coating a 1.6 nm thick ZnS layer on CdSe@ZnS. In 2017, one Korean research group inserted a polyethoxyethyleneimine layer between the MoOx and the quantum dot layer to balance the carrier injection, and improved the EQE of the inverted device to 15.6%. In 2016, through the tridentate thiol ligand exchange of ZnCdSe/ZnS quantum dots, research group of Li Linsong of Henan University increased the carrier injection capacity of the quantum dots, and the device's EQE reached 16.5%. With reported lifespan of more than 100,000 hours, the brightness and lifespan of green QLEDs have basically met commercial requirements.

In terms of blue QLED, most of the blue quantum dot structures reported in the literature are CdZnS/ZnS quantum dots. In 2013, one Korean research group obtained blue quantum dots with a particle size of 11.5 nm and a ZnS shell thickness of 2.6 nm through three hours of coating ZnS, the external quantum efficiency of the device reached 7.1%. In 2015, the research group of Li Linsong of Henan University treated the surface of CdZnS/ZnS quantum dots with octanethiol, and the highest EQE of the prepared device reached 12.2%, which was the first reported blue QLED device with an external quantum efficiency exceeding 10% in the world. For the blue quantum dots of other structures, such as ZnSe/ZnS structure, the best performance currently is QLED with the maximum brightness of 2632 cd/m$^2$ and the highest external quantum efficiency of 7.83%.

At present, the lifespan of blue QLED at the minimum screen brightness (100 cd/m$^2$) is generally several hundred hours, far from reaching the minimum commercial standard (10,000 hours).

It can be seen from the above that the existing blue QLEDs have a problem of poor luminous performance and need to be solved urgently.

SUMMARY

The main purpose of the present disclosure is to provide a core-shell quantum dot, a preparation method thereof, and an electroluminescent light-emitting device containing the same, so as to solve the problem of poor luminous performance of the existing blue QLEDs.

To achieve the aforesaid objectives, according to one aspect of the present disclosure, there is provided a core-shell quantum dot, wherein a core of the quantum dot is CdSe$_X$S$_{(1-X)}$, and shells of the quantum dot include a first shell and a second shell covering aforesaid first shell, the first shell being selected from one or more of ZnSe, ZnSe$_Y$S$_{(1-Y)}$ and Cd$_{(Z)}$Zn$_{(1-X)}$S, the second shell being one of Cd$_{(Z)}$Zn$_{(1-Z)}$S and ZnS, the maximum emission peak of the core-shell quantum dot being less than or equal to 480 nm, wherein, 0<X<1, 0<Y<1, 0<Z<1.

Further, the photoluminescence efficiency of the quantum dot is greater than or equal to 90%.

Further, the external quantum efficiency of the quantum dot is greater than or equal to 10%.

Further, in the core of the quantum dot, a mole ratio of selenium with respect to sulfur is 1:40~40:1.

Further, a diameter of aforesaid CdSe$_X$S$_{(1-X)}$ core is 2 to 5 nm, a thickness of aforesaid first shell is 1 to 5 nm, and a thickness of aforesaid second shell is 1 to 10 nm.

According to another aspect of the present disclosure, there is provided a method for preparing core-shell quantum dot, wherein including steps of: S1, heating a cadmium precursor, an elemental substance sulfur, an elemental substance selenium, and a ligand in a first solvent to react for preparing a first system containing CdSe$_X$S$_{(1-X)}$ cores, purifying aforesaid first system to obtain CdSe$_X$S$_{(1-X)}$ cores, and dispersing the CdSe$_X$S$_{(1-X)}$ cores in a second solvent to obtain a CdSe$_X$S$_{(1-X)}$ core solution; S2, mixing a first shell raw material and aforesaid CdSe$_X$S$_{(1-X)}$ core solution and heating to react for growing the first shell on the CdSe$_X$S$_{(1-X)}$ cores, and obtaining a CdSe$_X$S$_{(1-X)}$ core/first shell solution after the reaction; S3, mixing a second shell raw material and the CdSe$_X$S$_{(1-X)}$ core/first shell solution and heating to react for growing the second shell on aforesaid first shell, obtaining a third system containing CdSe$_X$S$_{(1-X)}$ core/first shell/second shell after the reaction, and purifying aforesaid third system to obtain CdSe$_X$S$_{(1-X)}$ core/first shell/second shell; wherein, the first shell raw material and the second shell raw material include independently an anionic precursor, a cationic precursor and a ligand correspondingly, the anionic precursor of the first shell being selected from one or two of elemental substance selenium and elemental substance sulfur, the cationic precursor of the first shell being selected from one or two of cadmium precursor and zinc precursor, the anionic precursor of the second shell being elemental substance sulfur, the cationic precursor of the second shell being selected from one or two of cadmium precursor and zinc precursor.

Further, aforesaid first solvent, aforesaid second solvent, and aforesaid third solvent are non-coordinating solvents.

Further, in aforesaid S1, a mole ratio of Cd in the cadmium precursor with respect to the sum of sulfur and selenium is 10:1~1:1.

Further, in aforesaid S1, a reaction temperature of the heating reaction is 180~280° C.; in aforesaid S2 or aforesaid S3, a reaction temperature of the heating reaction is 280~310° C.

Further, in aforesaid S2, in the first shell and the second shell, a mole ratio of the sum of the anionic precursor with respect to the sum of the cationic precursor is 1:10~2:1.

Further, in aforesaid S2, a mole ratio of the anionic precursor for the first shell with respect to the $CdSe_xS_{(1-X)}$ cores is 5:1~100:1.

Further, in aforesaid S3, a mole ratio of the anionic precursor for the second shell with respect to the $CdSe_xS_{(1-X)}$ core/first shell is 1:1~100:1.

Further, there is provided a quantum dot electroluminescent light-emitting device, wherein the quantum dot electroluminescent light-emitting device includes any one of aforesaid core-shell quantum dot.

Applying the technical scheme of the present disclosure, the core-shell quantum dots have $CdSe_xS_{(1-X)}$ as the core, one or more of ZnSe, $ZnSe_YS_{(1-Y)}$ and $Cd_{(Z)}Zn_{(1-Z)}S$ as the first shell ($0<X<1$, $0<Y<1$, $0<Z<1$). Compared with the traditional blue quantum dots with $Cd_{(Z)}Zn_{(1-Z)}S$ or ZnSe as the core, the $CdSe_xS_{(1-X)}$ core has a smaller bandgap and a shallower Highest Occupied Molecular Orbital (HOMO) energy level, making hole injection easier. The energy band of the first shell material is between the energy band of the core material and the energy band of the second shell material, which not only reduces the defect of the quantum dot core $CdSe_xS_{(1-X)}$, improves the photoluminescence efficiency of the quantum dots, but also reduces the carrier injection barrier, thereby effectively improving the external quantum efficiency and the expected lifespan, and solving the problem of poor luminescence performance of the existing blue QLEDs. In addition, the core-shell quantum dots also include a second shell formed of $Cd_{(Z)}Zn_{(1-Z)}S$ or ZnS, which plays the role of passivation of quantum dots and improves the overall stability of quantum dots.

DETAILED DESCRIPTION

It should be noted that the embodiments of the present disclosure and the features of the embodiments may be combined with each other in case of no conflict. The disclosure will be described in detail below with reference to the figures and in conjunction with the embodiments.

In order to enable a person skilled in the art to have a better understanding of the solution of the present disclosure, the technical solutions in the embodiments of the present disclosure will be clearly and completely described below with reference to the figures, but obviously, the described embodiments are merely a part of the embodiments of the invention rather than all of the embodiments. All other embodiments obtained by a person of ordinary skill in the art based on the embodiments of the present disclosure without creative efforts should fall within the scope of the present disclosure.

It should be noted that the terms "first", "second", and the like in the specification and claims of the present disclosure are used to distinguish similar objects, and are not necessarily used to describe a particular order or sequence. It should be understood that the number so used may be interchangeable when appropriate to facilitate the description of embodiments of the invention disclosed herein. Furthermore, the terms "include" and "have", as well as any variants thereof, are intended to cover a non-exclusive inclusion, for example, processes, methods, systems, products, or devices that include a series of steps or units are not necessarily limited to include those steps or units explicitly listed, and may include other steps or units not explicitly listed or inherent to such processes, methods, products or devices.

As used herein, the singular forms "a," "an" and "the" are intended to include the plural forms as well, unless the context clearly indicates otherwise.

As introduced in the background, the blue QLEDs in the prior art having a short lifespan under low screen brightness fail to meet the minimum commercial requirements, and have a problem of poor luminous performance. The inventors have conducted researches on the above problems and found that the root cause of the above problems is that blue quantum dots have a deeper HOMO energy level than green and red quantum dots (such as CdSe/ZnS, CdSe/CdS, CdSe/CdZnS, CdSe/ZnSe/ZnS), which makes carrier injection much more difficult than quantum dots with other emission wavelengths. However, use of core materials with a narrower band gap will cause a new problem, which is that the emission range of core-shell quantum dots is from green light to red light, making it difficult to emit blue light.

In order to solve the above-mentioned problems of poor luminous performance of the existing QLEDs, the inventors have studied the existing quantum dots with various structures, and surprisingly find that the above-mentioned problems can be solved by optimizing the various existing blue quantum dot structures. $CdSe_xS_{(1-X)}$ ($0<X<1$) is used as the core, with the core coated with one or more of ZnSe, $ZnSe_YS_{(1-Y)}$, $Cd_{(Z)}Zn_{(1-Z)}S$ ($0<Y<1$, $0<Z<1$) and the resulting outer layer subsequently coated with $Cd_{(Z)}Zn_{(1-Z)}S$ or ZnS ($0<Z<1$), which can synthesize high-efficiency blue quantum dots. The core-shell quantum dot of this new structure can improve the stability of quantum dot and reduce auger recombination. It can also improve the carrier injection problem of blue quantum dot through synthesis and surface treatment, enhance the brightness and lifespan of blue QLED devices, and achieve better luminous performance of the devices.

Based on the above ideas, this application provides a core-shell quantum dot and a preparation method thereof, and an electroluminescent light-emitting device containing the same. The core of the core-shell quantum dot is $CdSe_xS_{(1-X)}$, and the quantum dot shells include a first shell and a second shell covering the first shell, the first shell being selected from one or more of ZnSe, $ZnSe_YS_{(1-Y)}$ and $Cd_{(Z)}Zn_{(1-Z)}S$, the second shell being one of $Cd_{(Z)}Zn_{(1-Z)}S$ and ZnS, the maximum emission peak of the core-shell quantum dot is less than or equal to 480 nm, wherein, $0<X<1$, $0<Y<1$, $0<Z<1$.

In some embodiments, the first shell or the second shell may have multiple monolayers.

In these embodiments, structure of the core-shell quantum dot may include (in the form of core/first shell/second shell, wherein, $0<X<1$, $0<Y<1$, $0<Z<1$):

$CdSe_xS_{(1-X)}/ZnSe/ZnS$, $CdSe_xS_{(1-X)}/ZnSe/Cd_{(Z)}Zn_{(1-Z)}S$, $CdSe_xS_{(1-X)}/ZnSe_YS_{(1-Y)}/ZnS$, $CdSe_xS_{(1-X)}/ZnSe_yS_{(1-Y)}/Cd_{(Z)}Zn_{(1-Z)}S$, $CdSe_xS_{(1-X)}/Cd_{(Z)}Zn_{(1-Z)}S/ZnS$, $CdSe_xS_{(1-X)}/Cd_{(Z)}Zn_{(1-Z)}S/Cd_{(Z)}Zn_{(1-Z)}S$.

In these embodiments, the maximum emission peak of the core-shell quantum dots is less than or equal to 480 nm, and the quantum dots mainly emits blue light.

Applying the technical scheme of the present disclosure, the core-shell quantum dots of the new structure have $CdSe_xS_{(1-X)}$ as the core, one or more of ZnSe, $ZnSe_yS_{(1-Y)}$ and $Cd_{(Z)}Zn_{(1-Z)}S$ as the first shell. Compared with the traditional blue quantum dots with $Cd_{(Z)}Zn_{(1-Z)}S$ or ZnSe as the core, the $CdSe_xS_{(1-X)}$ core has a smaller bandgap and a shallower HOMO energy level (lower energy level value, larger absolute value), making hole injection easier; The energy band of the first shell material is between the energy band of the core material and the energy band of the second shell material, which not only reduces the defect of the quantum dot core $CdSe_xS_{(1-X)}$, improves the photoluminescence efficiency of the quantum dots, but also reduces the carrier injection barrier, thereby effectively improving the external quantum efficiency and the expected lifespan, and solving the problem of poor luminescence performance of the existing blue QLEDs; In addition, the core-shell quantum dots also include a second shell formed of $Cd_{(Z)}Zn_{(1-Z)}S$ or ZnS, which plays the role of passivation of quantum dots and improves the overall stability of quantum dots. Moreover, the band gap of the first shell and the second shell is wider than the band gap of the $CdSe_xS_{(1-X)}$ core, so the excitons can be confined to the core and blue light emission can be realized.

In these embodiments, $CdSe_xS_{(1-X)}$ is used as the core of blue quantum dots. $CdSe_xS_{(1-X)}$ is made small enough to achieve energy level broadening of core of quantum dots so as to meet the luminescence requirements of the blue quantum dots. At the same time, the core is also covered with double shells, which improves the injection capacity of holes, overcomes the problem of electrons and holes transmission imbalance, enhances the EQE, and greatly improves the stability of blue QLED. The second shell increases the stability of the core-shell quantum dots.

In order to make the blue quantum dots emit pure blue light, in some embodiments, the maximum emission peak of the core-shell quantum dots is less than or equal to 470 nm.

In some embodiments, the maximum emission peak of the core-shell quantum dots is greater than or equal to 460 nm.

In some embodiments, the photoluminescence efficiency of the core-shell quantum dots is greater than or equal to 90%. In some embodiments, the external quantum efficiency of the core-shell quantum dots is greater than or equal to 10%.

In some embodiments, in order to adjust the band gap width of the core of quantum dots to a suitable range for preparation of blue quantum dots, in the core of quantum dots, the mole ratio of selenium with respect to sulfur is 1:40~40:1.

In some embodiments, the diameter of the $CdSe_xS_{(1-X)}$ core is 2 to 5 nm, the thickness of the first shell is 2 to 5 nm, and the thickness of the second shell is 2 to 10 nm. The quantum dots in the range of diameter and thickness may have good photoluminescence efficiency and stability, but the aforesaid diameter and thickness include but is not limited to the aforesaid range.

Wherein, the aforesaid diameter is also referred to as particle diameter or particle size, and the diameter of the $CdSe_xS_{(1-X)}$ core refers to the diameter of a sphere similar to the core of quantum dots in terms of the size and shape.

In some embodiments, the core-shell quantum dots may have a $CdSe_xS_{(1-X)}/ZnSe/ZnS$ structure, and the maximum emission peak of the quantum dots of this structure may be tunable from 460 to 480 nm, which can emit pure blue light. On the other hand, most of the blue quantum dots applied for QLED are currently using the core of $Cd_{(Z)}Zn_{(1-Z)}S$ and the shell of ZnS, which generally have the problems of difficult carrier injection and unbalanced carrier injection. In the $CdSe_xS_{(1-X)}/ZnSe/ZnS$ structure of the present application, the $CdSe_xS_{(1-X)}$ core has a shallower HOMO and easier hole injection; the energy band of the first shell ZnSe is between the energy band of the $CdSe_xS_{(1-X)}$ core and the energy band of the second shell ZnS, not only reduces the defects of quantum dot core $CdSe_xS_{(1-X)}$, improves the photoluminescence efficiency of quantum dots, but also reduces the carrier injection barrier, thereby effectively improving the external quantum efficiency and expected lifespan.

The preparation methods of core-shell quantum dots in each of the aforesaid embodiments can be various. In order to facilitate the implementation of those skilled in the art, an alternative preparation method of core-shell quantum dots is also provided for the preparation of the core-shell quantum dots according to another aspect of the present application. The preparation method includes the following:

S1, heating a cadmium precursor, an elemental substance sulfur, an elemental substance selenium, and a ligand in a first solvent to react for preparing a first system containing $CdSe_xS_{(1-X)}$ cores, purifying the first system to obtain the $CdSe_xS_{(1-X)}$ cores, and dispersing the $CdSe_xS_{(1-X)}$ cores in a second solvent to obtain a $CdSe_xS_{(1-X)}$ core solution.

In some embodiments, in the S1, the mole ratio of Cd in the cadmium precursor with respect to the sum of sulfur and selenium is preferably but not limited to 10:1~1:1.

In some embodiments, in the S1, the reaction temperature of the heating reaction is preferably but not limited to 180~280° C.

In some embodiments, in the S1, the aforesaid first solvent and second solvent may be non-coordinating solvents. The cadmium precursor includes but not limited to cadmium oxide or cadmium acetate. The first solvent includes but not limited to the solution including octadecene. The second solvent includes but not limited to octadecene.

In the S2, mixing first shell raw material and the $CdSe_xS_{(1-X)}$ core solution (including the $CdSe_xS_{(1-X)}$ cores and the second solvent) and heating to react for growing the first shell on the $CdSe_xS_{(1-X)}$ core, and obtaining a $CdSe_xS_{(1-X)}$ core/first shell solution after the reaction.

In some embodiments, in the aforesaid S2, the heating reaction makes the first shell to grow on the $CdSe_xS_{(1-X)}$ core, and the process of obtaining the $CdSe_xS_{(1-X)}$ core/first shell solution after the reaction includes: heating to react for growing the first shell on the $CdSe_xS_{(1-X)}$ core, obtaining a second system containing the $CdSe_xS_{(1-X)}$ core/first shell after the reaction, purifying the second system to obtain the $CdSe_xS_{(1-X)}$ core/first shell, dispersing the $CdSe_xS_{(1-X)}$ core/first shell in a third solvent to obtain a $CdSe_xS_{(1-X)}$ core/first shell solution. Through these embodiments, purification can make the surface of the $CdSe_xS_{(1-X)}$ core/first shell cleaner, benefiting the improvement of the synthesis effect.

Wherein, the first shell raw material includes an anionic precursor, a cationic precursor and a ligand correspondingly. The anionic precursor of the first shell is selected from one or two of elemental substance selenium and elemental substance sulfur. The cationic precursor of the first shell is selected from one or two of cadmium precursor and zinc precursor.

The aforesaid zinc precursor includes but not limited to one or more of zinc oxide, zinc acetate, and basic zinc carbonate; the foregoing ligand includes but are not limited to trioctylphosphine or tributylphosphine, and the aforesaid cadmium precursor includes but not limited to one or more of cadmium oxide, cadmium acetate, cadmium stearate.

In some embodiments, in the S2, the reaction temperature of the heating reaction is preferably but not limited to 280~310° C.

In some embodiments, in the S2, in the first shell and the second shell, the mole ratio of the sum of the anionic precursor with respect to the sum of the cationic precursor is preferably but not limited to 1:10~2:1. In this application, the number of moles of the cationic precursor is calculated according to its cation.

In some embodiments, in the S2, the mole ratio of the anionic precursor for the first shell with respect to the $CdSe_xS_{(1-X)}$ cores is preferably but not limited to 5:1~100:1.

In some embodiments, in the S2, the aforesaid third solvent may be non-coordinating solvent, including but not limited to organic solvent such as squalene, octadecene and etc.

In the S3, mixing a second shell raw material and the $CdSe_xS_{(1-X)}$ core/first shell solution and heating to react for growing the second shell on the first shell, obtaining a third system containing $CdSe_xS_{(1-X)}$ core/first shell/second shell after the reaction, and purifying the third system to obtain $CdSe_xS_{(1-X)}$ core/first shell/second shell.

Wherein, the second shell raw material which is independent from the first shell raw material includes an anionic precursor, a cationic precursor and a ligand correspondingly. The anionic precursor of the second shell is elemental substance sulfur, and the cationic precursor of the second shell is selected from one or two of cadmium precursor and zinc precursor.

The ligands in the first shell raw material and the second shell raw material and in the aforesaid S1 are the same or different.

In some embodiments, in the S3, the reaction temperature of the heating reaction is preferably but not limited to 280~310° C.

In some embodiments, in the S3, the mole ratio of the anionic precursor for the second shell with respect to the $CdSe_xS_{(1-X)}$ core/first shell is preferably but not limited to 1:1~100:1.

Applying the aforesaid preparation method of the present application, the prepared core-shell quantum dots have $CdSe_xS_{(1-X)}$ as the core, one or more of ZnSe, $ZnSe_yS_{(1-Y)}$ and $Cd_{(Z)}Zn_{(1-Z)}S$ as the first shell. Compared with the traditional blue quantum dots with $Cd_{(Z)}Zn_{(1-Z)}S$ or ZnSe as the core, the $CdSe_xS_{(1-X)}$ core has a smaller bandgap and a shallower HOMO energy level, making hole injection easier; The energy band of the first shell material is between the energy band of the core material and the energy band of the second shell material, which not only reduces the defect of the quantum dot core $CdSe_xS_{(1-x)}$, improves the photoluminescence efficiency of the quantum dots, but also reduces the carrier injection barrier, thereby effectively improving the external quantum efficiency and the expected lifespan, and solving the problem of poor luminescence performance of the existing blue QLEDs; In addition, the core-shell quantum dots also include a second shell formed of $Cd_{(Z)}Zn_{(1-Z)}S$ or ZnS, which plays the role of passivation of quantum dots and improves the overall stability of quantum dots.

According to another aspect of the present application, a quantum dot electroluminescent light-emitting device is also provided. The quantum dot electroluminescent light-emitting device includes the aforesaid quantum dots.

With the aforesaid embodiment, since the quantum dot light-emitting device includes the aforesaid core-shell quantum dots, and the aforesaid core-shell quantum dots have $CdSe_xS_{(1-X)}$ as the core, one or more of ZnSe, $ZnSe_yS_{(1-Y)}$ and $Cd_{(Z)}Zn_{(1-Z)}S$ as the first shell, and have the ability to emit blue light, and have a shallower HOMO energy level, which reduces the carrier injection barrier, and effectively improves the external quantum efficiency and the expected lifespan; the core-shell quantum dots also include a second shell formed of $Cd_{(Z)}Zn_{(1-Z)}S$ or ZnS, which plays the role of passivation of quantum dots and improves the overall stability of quantum dots.

EMBODIMENTS

Embodiment 1

Take the preparation of $CdSe_xS_{(1-X)}$/ZnSe/ZnS core-shell quantum dots as an example:

S1: Preparation of $CdSe_xS_{(1-X)}$ cores (diameter 3.2 nm, the mole ratio of Se to S being 1:40):

S101: Mixing 4 mmol of cadmium oxide with the solution consisting of 10 mmol of stearic acid and 10 mL of octadecene, dissolving under heating in an inert gas atmosphere, and cooling to room temperature;

S102: Weighing and adding 0.0243 mmol of Se powder and 0.957 mmol of sulfur powder to the solution formed in Step S101 through a funnel, quickly stirring and raising the temperature to 280V in an inert gas atmosphere, and reacting for 5 min to obtain a quantum dot solution of $CdSe_xS_{(1-X)}$ cores;

S103: Precipitating the $CdSe_xS_{(1-X)}$ cores with enough methanol/acetone mixture followed by centrifugation, and re-dispersing the solid powder of $CdSe_xS_{(1-X)}$ core in octadecene.

S2, Preparing the first shell of ZnSe (thickness 2.8 nm):

S201: Dissolving 1 mmol of Se powder in 1 mL of trioctylphosphine under the protection of an inert gas atmosphere, and then mixing with 0.1 mmol of $CdSe_xS_{(1-X)}$ cores as an injection solution.

S202: Mixing 4 mmol of zinc oxide with 10 mmol of fatty acid and 10 mL of octadecene solution, heating to dissolve under an inert gas atmosphere, then heating to 300° C., injecting with the injection solution of Step 201, and keeping at 300° C. for 0.5 h. The reaction is completed and cooled to room temperature.

S203: Precipitating the $CdSe_xS_{(1-X)}$/ZnSe quantum dots with enough methanol/acetone mixture followed by centrifugation, and re-dispersing the solid powder of $CdSe_xS_{(1-X)}$/ZnSe in octadecene.

S3, Preparing the second shell of ZnS (7.9 nm);

S301: Dissolving 5 mmol of S powder in 5 mL of trioctylphosphine under the protection of an inert gas atmosphere.

S302: Mixing 10 mmol of zinc oxide with the solution consisting of 25 mmol of fatty acid and 10 mL of octadecene, heating to dissolve under an inert gas atmosphere, then heating to 310° C., injecting with $CdSe_xS_{(1-X)}$/ZnSe quantum dots and the injection solution obtained in of Step 301 of Step 1 in turn, and keeping at 300° C. for 2 h. The reaction is completed and cooled to room temperature.

S303: Precipitating the $CdSe_xS_{(1-X)}$/ZnSe/ZnS quantum dots with enough methanol/acetone mixture followed by centrifugation, and re-dispersing the solid powder in n-octane or toluene.

Preparing QLED:

Using the obtained $CdSe_xS_{(1-x)}$/ZnSe/ZnS core-shell quantum dots as the material of a quantum dot light-emitting layer to make a quantum dot electroluminescent light-emitting device with a structure of ITO/PEDOT:PSS/PVK/quantum dots/ZnO/Ag. The specific preparation process is as follows:

1) Cleaning anode ITO (indium tin oxide) with a thickness of 200 nm.

Performing respective ultrasonic cleaning with ethanol, deionized water and acetone for 10 minutes, and then drying the liquid attached to the glass surface with $N_2$, and going through ozone-ultraviolet treatment for 10 minutes to remove impurities on the ITO surface to obtain clean ITO transparent conductive glass.

2) Making a first functional layer (PEDOT:PSS/PVK).

Spin-coating PEDOT:PSS (poly-p-styrene sulfonic acid solution) on a clean ITO transparent conductive glass at a speed of 4000 rpm for 50 seconds in an air environment; annealing in air at 150° C. for 30 minutes after the spin-coating is completed; transferring the ITO to a glove box filled with nitrogen, and annealing at 130° C. for 20 minutes. Finally, forming a PEDOT:PSS layer on the ITO surface, that is, forming a hole injection layer. Then spin-coating a chlorobenzene solution of poly (N-vinylcarbazole) (PVK) (at a concentration of 8 mg/mL) on the PEDOT:PSS layer at a speed of 2000 rpm for 45 seconds; annealing in the glove box at 150° C. for 30 minutes to form a PVK hole transport layer after the spin coating.

3) Making quantum dot light-emitting layer.

Spin-coating a layer of the core-shell quantum dot solution on the aforesaid PVK hole transport layer at a rotation speed of 2000 rpm for 45 seconds, the core-shell quantum dots of the core-shell quantum dot solution are dispersed in n-octane, with a concentration of 30 mg/mL.

4) Making a second functional layer (ZnO).

Spin-coating a layer of ethanol solution of zinc oxide nanocrystals on the quantum dot light-emitting layer at a rotation speed of 2000 rpm for 45 seconds.

5) Making a cathode (Ag).

Placing the spin-coated device in a vacuum evaporation chamber to evaporate the cathode silver electrode with a thickness of 100 nm, finally obtaining a quantum dot electroluminescent light-emitting device.

Embodiments 2 to 6

The differences between Embodiment 1 and Embodiments 2 to 6 are that the mole ratio of Se to S in the core, core diameter, first shell material, first shell thickness, second shell material, second shell thickness, and the structure of core-shell quantum dots, as shown in Table 1 below.

Comparative Embodiment 1

The difference between Embodiment 1 and Comparative Embodiment 1 is that the quantum dots are prepared by the method of Li Linsong's research group, and the surface of ZnCdS/ZnS quantum dots is treated with octanethiol; the process of preparing QLED is the same as Embodiment 1, except that the aforesaid ZnCdS/ZnS quantum dots are used for the material of the light-emitting layer.

The specific preparation method of ZnCdS/ZnS quantum dots is as follows: In a 100 mL round bottom flask, 0.4 mmol of CdO, 0.1 mmol of ZnO, 15 mL of mineral oil and 1 mL of OA were added and mixed, heated to 150° C., depressurized to and maintained at the pressure of 0.1 torr for 20 minutes followed by nitrogen bubbling, heated to 300° C. to obtain a mixture of $Cd(OA)_2$ and $Zn(OA)_2$. 0.5 mmol of S powder dissolved in 2 mL of ODE was quickly added to the aforesaid mixture to obtain a solution. The solution was heated to 310° C. concurrently with nitrogen bubbling and continuous stirring. A certain amount of $Zn(OA)_2$ and S were injected into the aforesaid solution dropwise with a syringe at 6 mL/h. After injection, the solution was continuously heated to and maintained at 310° C. for 30 min, then cooled to room temperature, and the prepared ZnCdS/ZnS quantum dots were finally purified with acetone or methanol. 0.5 g of pure ZnCdS/ZnS quantum dots were added to 10 mL of chlorobenzene, and 5 mL of hexanethiol/octanethiol/decyl mercaptan/dodecanethiol were added to the quantum dots to disperse them, then stirring at room temperature for 30 min, and then washing them with acetone.

TABLE 1

| | | Core | | First shell | | Second shell | |
|---|---|---|---|---|---|---|---|
| Embodiment | Se:S | Material | Diameter | Material | Thickness | Material | Thickness |
| 1 | 1:40 | $CdSe_{1/41}S_{40/41}$ | 3.2 | ZnSe | 2.8 | ZnS | 7.9 |
| 2 | 1:6 | $CdSe_{1/7}S_{6/7}$ | 2.1 | $Cd_{0.2}Zn_{0.8}S$ | 3.3 | ZnS | 4.9 |
| 3 | 9:1 | $CdSe_{0.9}S_{0.1}$ | 4.2 | $ZnSe_{0.5}S_{0.5}$ | 4.9 | $Cd_{0.1}Zn_{0.9}S$ | 2.2 |
| 4 | 40:1 | $CdSe_{40/41}S_{1/41}$ | 5.0 | $ZnSe_{0.5}S_{0.5}$ | 2.0 | ZnS | 9.8 |
| 5 | 1:40 | $CdSe_{1/41}S_{40/41}$ | 3.2 | ZnSe | 2.8 | $Cd_{0.1}Zn_{0.9}S$ | 2.2 |
| 6 | 1:40 | $CdSe_{1/41}S_{40/41}$ | 3.2 | $Cd_{0.2}Zn_{0.8}S$ | 3.3 | $Cd_{0.1}Zn_{0.9}S$ | 2.2 |

In Table 1 above, the aforesaid diameter and thickness are in nm, and Se:S refers to the mole ratio.

Detection Methods:

1) Transmittance electron microscopy test was performed on the core-shell quantum dots in Embodiments 1 to 6 to obtain the core diameter and shell thickness:

The morphology of the quantum dots at different growth stages in each embodiment was tested by transmission electron microscopy. After Step S1, Step S2 and Step S3, the products were tested by transmission electron microscopy to obtain surface morphology and size data respectively, and then the average diameter of $CdSe_xS_{(1-x)}$ core, the average thickness of the first shell and the average thickness of the second shell were obtained based on the size data of three measurements.

2) Spectral test and brightness test were conducted on the core-shell quantum dots in Embodiments 1 to 6 and Comparative Embodiment 1:

UV3600 fluorescence spectrometer was used to measure the wavelength corresponding to the emission peak (maximum peak wavelength), and the full width at half maximum; measured the brightness.

3) The photoluminescence efficiency of the core-shell quantum dots in Embodiments 1 to 6 and Comparative Embodiment 1 were tested:

The core-shell quantum dots were arranged on the light emission side of the ultraviolet light-emitting device. The light-emitting device encapsulated by epoxy resin includes sequentially laminated ultraviolet LEDs and a light diffusion plate. The photoluminescent spectral area of the core-shell quantum dots was integrated by integrating sphere to obtain the photoluminescence efficiency of the core-shell quantum dots.

Quantum dot photoluminescence efficiency=(emission peak area of blue quantum dots)/(peak area of ultraviolet backlight minus peak area of light of other colors that are not absorbed through the quantum dot material)×100%.

4) The external quantum efficiency and lifespan of the QLED devices in Embodiments 1 to 6 and Comparative Embodiment 1 were tested:

An UV3600 fluorescence spectrometer was used to measure the wavelength (peak wavelength) corresponding to the emission peak, and a PR670 spectrophotometer/colorimeter/radiometer made by PHOTORESEARCH was used to perform a spectral test to measure the maximum external quantum efficiency (EQE); the lifespan test condition was 100 cd/m².

The test results are shown in Table 2 below:

TABLE 2

| Embodiment | Maximum peak wavelength | Full width at half maximum | Photoluminescence efficiency | Maximum external quantum efficiency | Lifespan (h) | Maximum brightness (cd/m²) |
|---|---|---|---|---|---|---|
| 1 | 462 nm | ≤25 nm | 91.5% | 11.3% | >1000 | >12000 |
| 2 | 480 nm | ≤25 nm | 99.7% | 12.3% | >1200 | >20000 |
| 3 | 472 nm | ≤25 nm | 97.6% | 11.9% | >1000 | >15000 |
| 4 | 466 nm | ≤25 nm | 90.5% | 10.2% | >1000 | >13000 |
| 5 | 470 nm | ≤25 nm | 93.2% | 11.9% | >2000 | >13000 |
| 6 | 468 nm | ≤25 nm | 92.6% | 11.4% | >2100 | >10000 |
| Comparative Embodiment 1 | 452 nm | ≤25 nm | 90.2% | 10.1% | ≈600 | 7800 |

It can be seen from the above that the new core-shell quantum dots of the present application are blue quantum dots with a high luminous efficiency. The blue QLED prepared by using the core-shell quantum dots emits a purer blue light and has a higher luminous efficiency, an tunable wavelength, a longer lifespan compared to the existing blue QLEDs in Comparative Embodiment 1, and the brightness is significantly improved compared to Comparative Embodiment 1.

From the above description, it can be seen that the aforesaid embodiments of the present disclosure achieve the following technical effects:

1. The core-shell quantum dots have $CdSe_xS_{(1-X)}$ as the core, and one or more of ZnSe, $ZnSe_YS_{(1-Y)}$ and $Cd_{(Z)}Zn_{(1-Z)}S$ as the first shell, and compared with the traditional blue quantum dots with $Cd_{(Z)}Zn_{(1-Z)}S$ or ZnSe as the core, the $CdSe_xS_{(1-X)}$ core has a smaller bandgap, wherein, 0<X<1, 0<Y<1, 0<Z<1, as well as a shallower HOMO energy level, making hole injection easier;

2. The energy band of the first shell material is between the energy band of the core material and the energy band of the second shell material, which not only reduces the defects of quantum dot core $CdSe_xS_{(1-X)}$, improves the photoluminescence efficiency of quantum dots, but also reduces the carrier injection barrier, thereby effectively improving the external quantum efficiency and expected lifespan and solving the problem of poor luminous performance of the existing blue QLEDs;

3. The core-shell quantum dots also include a second shell formed of $Cd_{(Z)}Zn_{(1-Z)}S$ or ZnS, which plays the role of passivation of quantum dots and improves the overall stability of quantum dots.

4. The electroluminescent light-emitting device including the core-shell quantum dots has a higher external quantum efficiency and emits a purer blue light, with a longer lifespan, an tunable wavelength and improved brightness.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A core-shell quantum dot, wherein a core of said quantum dot is $CdSe_xS_{(1-X)}$, and shells of said quantum dot comprise a first shell and a second shell covering said first shell, said first shell being selected from one or more of ZnSe, $ZnSe_YS_{(1-Y)}$ and $Cd_{(Z)}Zn_{(1-Z)}S$, said second shell being one of $Cd_{(Z)}Zn_{(1-Z)}S$ and ZnS, a maximum emission peak of said core-shell quantum dot being less than or equal to 480 nm, wherein, 0<X<1, 0<Y<1, 0<Z<1; a photoluminescence efficiency of said quantum dot is greater than or equal to 90%.

2. The core-shell quantum dot according to claim 1, wherein an external quantum efficiency of said quantum dot is greater than or equal to 10%.

3. The core-shell quantum dot according to claim 1, wherein in said core of said quantum dot, a mole ratio of selenium with respect to sulfur is 1:40~40:1.

4. The core-shell quantum dot according to claim 1, wherein a diameter of said $CdSe_xS_{(1-X)}$ core is 2 to 5 nm, a thickness of said first shell being 1 to 5 nm, a thickness of said second shell being 1 to 10 nm.

5. A method for preparing core-shell quantum dot, wherein comprising steps of:

S1, heating a cadmium precursor, an elemental substance sulfur, an elemental substance selenium, and a ligand in a first solvent to react for preparing a first system containing $CdSe_xS_{(1-X)}$ cores, purifying said first system to obtain said $CdSe_xS_{(1-X)}$ cores, and dispersing said $CdSe_xS_{(1-X)}$ cores in a second solvent to obtain a $CdSe_xS_{(1-X)}$ core solution;

S2, mixing a first shell raw material and said $CdSe_xS_{(1-X)}$ core solution and heating to react for growing a first shell on said $CdSe_xS_{(1-X)}$ cores, and obtaining a $CdSe_xS_{(1-X)}$ core/first shell solution after the reaction;

S3, mixing a second shell raw material and said CdSe$_x$S$_{(1-x)}$ core/first shell solution and heating to react for growing a second shell on said first shell, obtaining a third system containing CdSe$_x$S$_{(1-x)}$ core/first shell/second shell after the reaction, and purifying said third system to obtain CdSe$_x$S$_{(1-x)}$ core/first shell/second shell;

wherein, said first shell raw material and said second shell raw material comprise an anionic precursor, a cationic precursor and a ligand correspondingly, said anionic precursor of said first shell being selected from one or two of elemental substance selenium and elemental substance sulfur, said cationic precursor of said first shell being selected from one or two of cadmium precursor and zinc precursor, said anionic precursor of said second shell being elemental substance sulfur, said cationic precursor of said second shell being selected from one or two of cadmium precursor and zinc precursor; in said S2 or said S3, a reaction temperature of said heating reaction is 280~310° C.

6. He method for preparing core-shell quantum dot according to claim 5, wherein said first solvent and said second solvent are non-coordinating solvents.

7. The method for preparing core-shell quantum dot according to claim 5, wherein in said S1, a mole ratio of Cd in said cadmium precursor with respect to the sum of sulfur and selenium is 10:1~1:1.

8. The method for preparing core-shell quantum dot according to claim 5, wherein in said S1, a reaction temperature of said heating reaction is 180~280° C.

9. The method for preparing core-shell quantum dot according to claim 5, wherein in said S2, in said first shell and said second shell, a mole ratio of the sum of said anionic precursor with respect to the sum of said cationic precursor is 1:10~2:1.

10. The method for preparing core-shell quantum dot according to claim 5, wherein in said S2, a mole ratio of said anionic precursor for said first shell with respect to said CdSe$_x$S$_{(1-x)}$ cores is 5:1~100:1.

11. The method for preparing core-shell quantum dot according to claim 5, wherein in said S3, a mole ratio of said anionic precursor for said second shell with respect to said CdSe$_x$S$_{(1-x)}$ core/first shell is 1:1~100:1.

12. A quantum dot electroluminescent light-emitting device, wherein said quantum dot electroluminescent light-emitting device comprises said core-shell quantum dots according to claim 1.

13. The quantum dot electroluminescent light-emitting device according to claim 12, wherein an external quantum efficiency of said quantum dot is greater than or equal to 10%.

14. The quantum dot electroluminescent light-emitting device according to claim 12, wherein in said core of said quantum dot, a mole ratio of selenium with respect to sulfur is 1:40~40:1.

15. The quantum dot electroluminescent light-emitting device according to claim 12, wherein a diameter of said CdSe$_x$S$_{(1-x)}$ core is 2 to 5 nm, a thickness of said first shell being 1 to 5 nm, a thickness of said second shell being 1 to 10 nm.

* * * * *